United States Patent
Kinugawa et al.

[19]

[11] Patent Number: 6,141,360
[45] Date of Patent: *Oct. 31, 2000

[54] TUNABLE WAVELENGTH LASER LIGHT SOURCE APPARATUS USING A COMPOUND CAVITY SUCH AS A COMPOUND CAVITY SEMICONDUCTOR LASER

[75] Inventors: Shigeru Kinugawa, Tokyo; Shigenori Mattori, Sagamihara, both of Japan

[73] Assignee: Anritsu Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/701,027

[22] Filed: Aug. 21, 1996

[30] Foreign Application Priority Data

Aug. 25, 1995 [JP] Japan .................... 7-240819

[51] Int. Cl.[7] ....................................... H01S 3/10
[52] U.S. Cl. ............................. 372/20; 372/102
[58] Field of Search .............. 372/92, 102, 98, 372/32, 20, 18, 10, 97, 100, 24

[56] References Cited

U.S. PATENT DOCUMENTS

| | | | |
|---|---|---|---|
| 3,443,243 | 5/1969 | Patel | 372/97 |
| 3,497,826 | 2/1970 | Foster | 372/97 |
| 3,559,102 | 1/1971 | Ueki | 372/97 |
| 3,582,820 | 6/1971 | Snitzer | 372/68 |
| 3,753,148 | 8/1973 | Billman | 372/97 |
| 4,025,875 | 5/1977 | Fletcher et al. | 372/18 |
| 4,079,339 | 3/1978 | Kobayashi et al. | 372/97 |
| 4,101,845 | 7/1978 | Russer . | |
| 4,174,504 | 11/1979 | Chenausky et al. | 372/97 |
| 4,328,468 | 5/1982 | Krawczak et al. | 372/97 |
| 4,512,021 | 4/1985 | Chrnausky et al. | 372/20 |
| 4,550,410 | 10/1985 | Chenausky et al. | 372/97 |
| 4,852,115 | 7/1989 | Viherkoski | 372/97 |
| 4,868,834 | 9/1989 | Fox et al. | 372/102 |

(List continued on next page.)

FOREIGN PATENT DOCUMENTS

| | | |
|---|---|---|
| 2306551 | 10/1976 | France . |
| 3-274784 | 12/1991 | Japan . |
| 7-106710 | 4/1995 | Japan . |
| 2271463 | 4/1994 | United Kingdom . |

OTHER PUBLICATIONS

W.T. Tsang et al; High–speed direct single–frequency modulation with large tuning rate and frequency excursion in cleaved–coupled–cavity semiconductor lasers; Apr. 15, 1983; pp. 650–652; Appl. Phys. Lett. vol. 42, No. 8.

Electronics Letters, vol. 27, No. 2, Jan. 17, 1991; pp. 183–184.

P.A. Ruprecht et al; Enhancing diode laser tuning with a short external cavity; Apr. 1992; pp. 82–86; Optics Communications.

Soviet Journal Of Quantum Electronics, vol. 16, May, 1986, New York, USA pp. 610–612, V.N. Bel'tyugov et al, "Use of Combined Resonators in Widening the Continuous Tuning Band of the Emission Frequency of Gas Lasers".

(List continued on next page.)

*Primary Examiner*—Teresa M. Arroyo
*Assistant Examiner*—Robert E. Wise
*Attorney, Agent, or Firm*—Frishauf, Holtz, Goodman, Langer & Chick, P.C.

[57] ABSTRACT

A laser light source apparatus includes a compound cavity and an optical gain medium. The compound cavity includes first, second, and third optical reflection members disposed along the optical axis. The first optical reflection member has a light wavelength selectivity. At least one of the first to third optical reflection members can change its own position on an optical axis in relation to the other reflection members. Two of the first to third optical reflection members are provided opposite to each other with the optical gain medium inserted therebetween, thereby forming a laser light source. The other one optical reflection member is provided so as to form a light path for feeding laser light emitted from the laser light source back to the laser light source.

11 Claims, 10 Drawing Sheets

U.S. PATENT DOCUMENTS

| | | | |
|---|---|---|---|
| 4,873,692 | 10/1989 | Johnson et al. | 372/100 |
| 4,920,541 | 4/1990 | Baumgartner et al. | 372/20 |
| 4,956,843 | 9/1990 | Akhavan-Leilabady et al. | 372/68 |
| 5,054,028 | 10/1991 | Esherick et al. | 372/32 |
| 5,140,599 | 8/1992 | Trutna et al. | 372/20 |
| 5,148,445 | 9/1992 | Liu et al. | 372/68 |
| 5,161,165 | 11/1992 | Zorabedian | 372/102 |
| 5,218,610 | 6/1993 | Dixon | 372/20 |
| 5,272,708 | 12/1993 | Esterowitz et al. | 372/20 |
| 5,272,713 | 12/1993 | Sobey et al. | 372/68 |
| 5,289,482 | 2/1994 | Esterowitz et al. | 372/68 |
| 5,392,308 | 2/1995 | Welch et al. | 372/20 |
| 5,442,651 | 8/1995 | Maeda | 372/20 |
| 5,491,714 | 2/1996 | Kitamura | 372/92 |
| 5,493,575 | 2/1996 | Kitamura | 373/20 |
| 5,548,609 | 8/1996 | Kitamura | 372/102 |
| 5,651,018 | 7/1997 | Mehuys et al. | 372/102 |
| 5,684,623 | 11/1997 | King et al. | 372/20 |

OTHER PUBLICATIONS

Optics Communications, vol. 107, No. 1/02, Apr. 1, 1994, pp. 83–87, Atutov S. N. et al, "A 670 NM External–Cavity Single Mode Diode Laser Continuously Tunable Over 18 GHz Range".

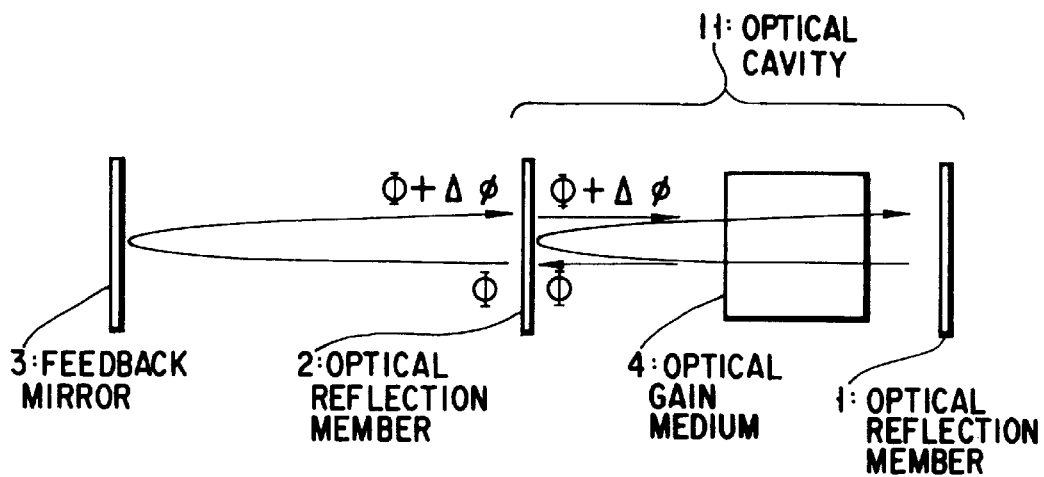
F I G. 3A   ΔΦ IS NORMALLY π
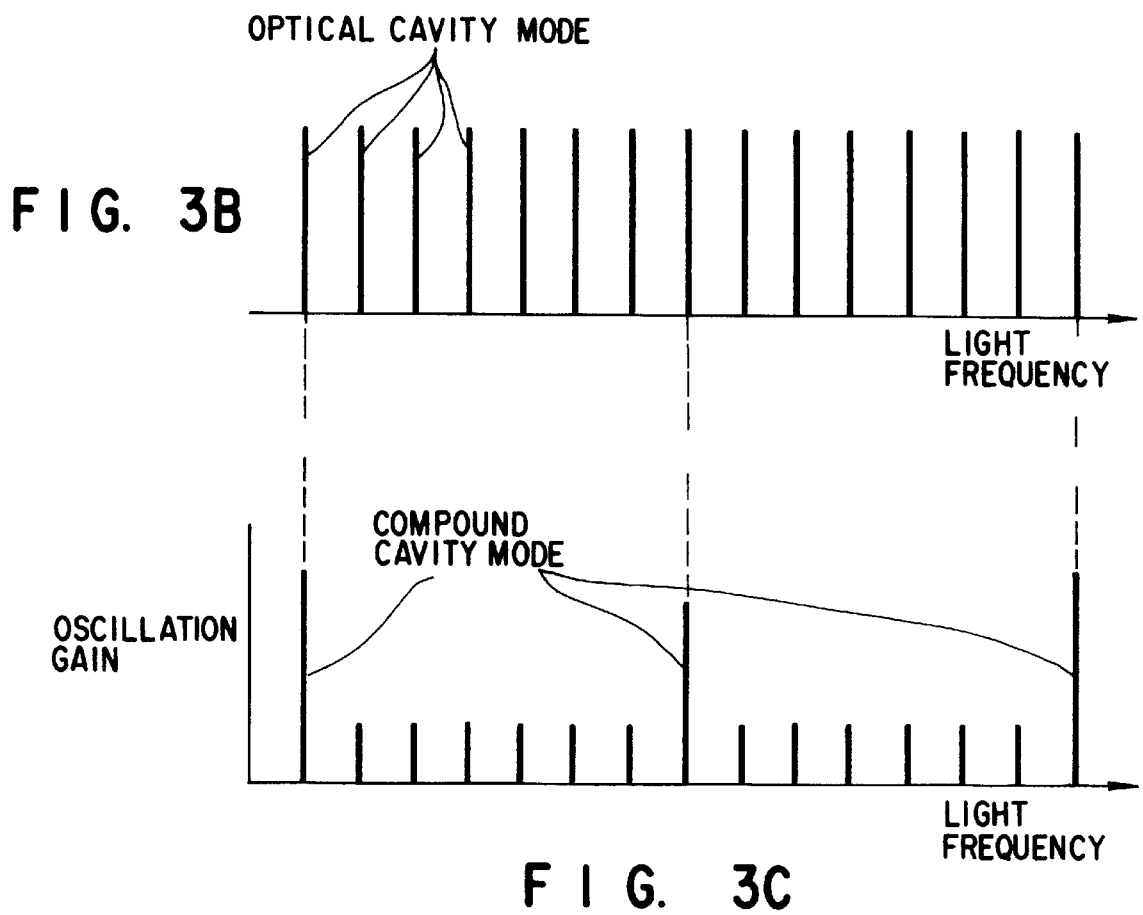

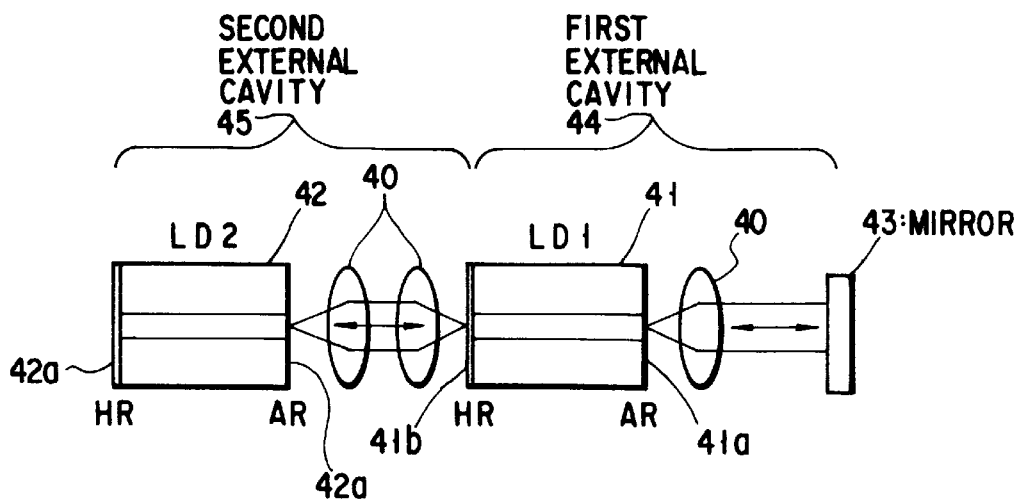
FIG. 8 (PRIOR ART)
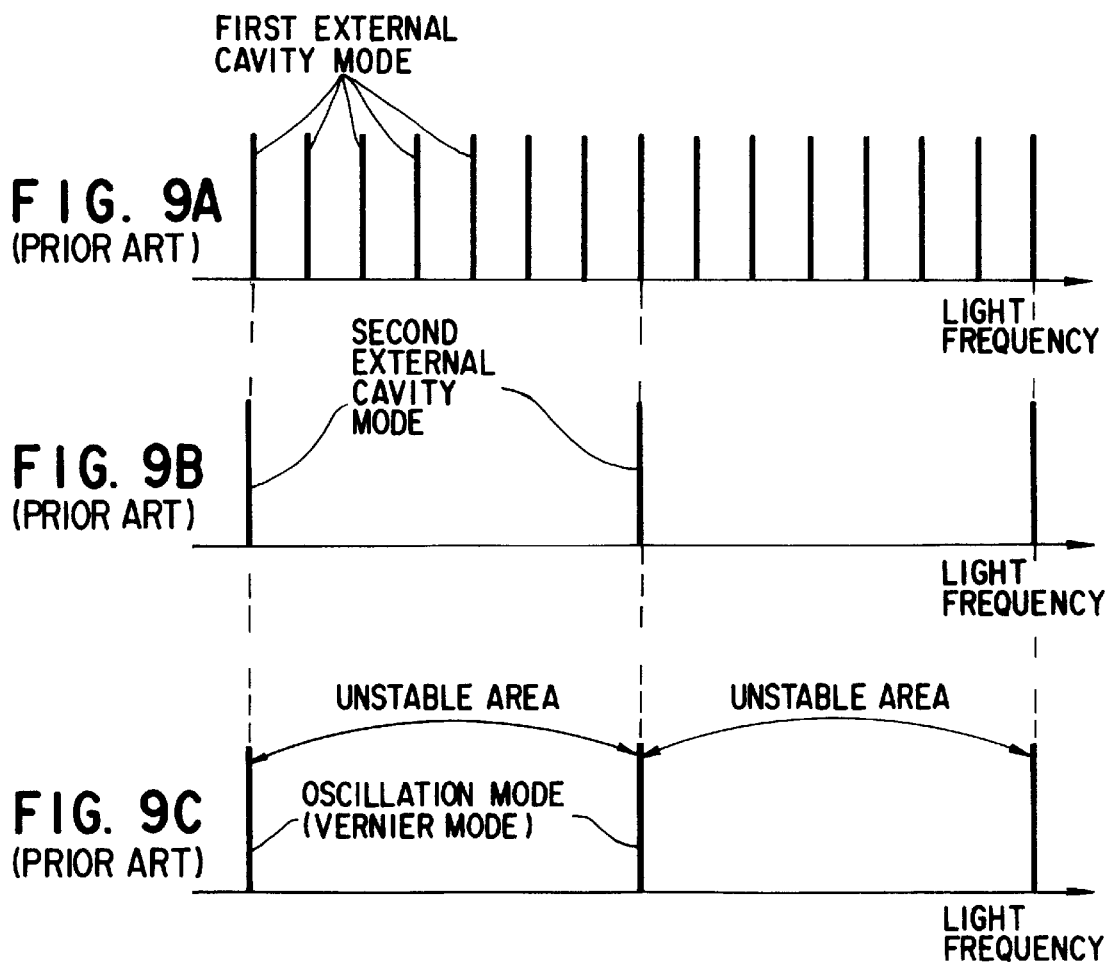
FIG. 9A (PRIOR ART)
FIG. 9B (PRIOR ART)
FIG. 9C (PRIOR ART)

TUNABLE WAVELENGTH LASER LIGHT SOURCE APPARATUS USING A COMPOUND CAVITY SUCH AS A COMPOUND CAVITY SEMICONDUCTOR LASER

BACKGROUND OF THE INVENTION

1. Field of the Invention

The present invention generally relates to a laser light source apparatus used in the field of optical communication, optical wavelength measurement, and the like, and particularly, to a tunable wavelength laser light source apparatus which can be used as a light wavelength (or frequency) control system, and which has a high mode stability, and a high wavelength setting resolution ability.

2. Description of the Related Art

With respect to conventional techniques of a tunable wavelength laser light source apparatus, the following three types of apparatuses are known.

(1) An external cavity laser light source apparatus

As shown in FIG. 6A, in an external cavity laser light source apparatus, one end surface 21a of a semiconductor laser 21 is provided with an anti-reflection coating (AR coating). An optical cavity is constituted between a reflection mirror 22 (referred to as a diffraction grating 22 shown in FIG. 6A) provided on the AR coating surface 21a side with a collimating lens 20 interposed therebetween, and another high reflection (HR) surface 21b of the semiconductor laser 21, where no AR coating is provided.

Thus, laser oscillation is enabled by the gain of the semiconductor laser 21.

In this case, the reflection mirror 22 is constituted by a diffraction grating having a reflection wavelength selectivity and is additionally provided with a diffraction grating rotation mechanism 25 constituted by a piezo-electric element (e.g., PZT) 23 and a stepping motor 24, so that the resonating light wavelength is selected. Thus, the oscillation wavelength can be controlled over a wide band, by controlling the diffraction grating 22, as shown in FIG. 6B.

Here, in the diffraction grating 22, a number of grooves are formed on a substrate, at a concentration of several hundreds per mm. Incidence light which is directed at a predetermined incident angle to the diffraction grating 22 is diffracted at such an angle which makes light diffused by each groove satisfy Bragg diffraction condition.

Therefore, since the interval between the diffraction grooves is constant, the angle at which light is diffracted by the diffraction grating 22 changes if the wavelength of incidence light which is directed to the diffraction grating 22 changes.

Inversely, if the diffraction grating 22 is rotated and the incident angle of the incidence light is changed, the apparatus behaves in a manner in which the groove interval of the diffraction grating 22 substantially changes in accordance with changes in the incidence angle, and therefore, the wavelength of light diffused to a predetermined spatial position from the diffraction grating 22 changes.

In the case where this kind of diffraction grating 22 is used as a reflection mirror for an external cavity laser, the setting angle of the diffraction grating 22 is decided by a required wavelength and the number of grooves such that the diffracted light corresponds to the light axis of the incidence light. (This is called a Littrow arrangement.) In this Littrow arrangement, that wavelength which makes the reflection light so as to correspond to the optical axis of the incidence light is called a Littrow wavelength.

Therefore, spontaneous emission light of a wide wavelength band generated by an AR-coated semiconductor laser 21 is reflected and amplified by the diffraction grating 22, and therefore, the external cavity light source oscillates at the Littrow wavelength.

In this state, if the diffraction grating 22 is rotated, the Littrow wavelength changes and the oscillation wavelength of the light source can be swept.

(2) A semiconductor laser light source apparatus

This semiconductor laser light source apparatus is a light source technique using a $C^3$ (Cleaved Coupled Cavity) laser constructed in a monolithic structure, as disclosed in Jpn. Pat. Appln. KOKAI Publication No. 3-274784. The $C^3$ laser is a famous device known as a compound cavity laser.

As for the $C^3$ laser, the structure and the principle thereof are taught in the reference "Applied Physics Letter 4(8), Apr. 15, 1983, pp. 650 to 652" and the likes, and the detailed description thereof will be omitted herefrom.

As shown in FIG. 7A, in this prior art technique, an AR coating surface 32a is formed by providing an AR coating on one of two semiconductor lasers 31 and 32 which constitute the $C^3$ laser 30, whose active layers 35 are optically coupled with each other, and which are respectively supplied with injection currents If and Ir.

Further, a first external optical cavity is formed between a diffraction grating 34 and a creep surface 32b which are provided so as to the AR coating surface 32a, with a collimating lens 33 interposed therebetween.

As shown in FIG. 7B, in another structure, an AR coating is provided on the output end surface of the semiconductor laser 31, to form an AR coating surface 31a.

In practical use, the cavity lengths L1 and L2 of these first and second external cavities are made substantially correspond to each other.

According to this structure, the interval of a vernier mode in which first and second external cavities oscillate with the cavity modes of both external cavities corresponding to each other.

In the operation of the semiconductor laser apparatus, at first, mutual optical injection-locking is taken between the first external cavity constituted by the diffraction grating 34 and the creep surface 31b of one semiconductor laser 32 forming part of the $C^3$ laser 30, and the second external cavity including the other semiconductor laser 31 forming part of the $C^3$ laser 30.

In this state, the diffraction grating 34 is rotated by a drive mechanism 36, and thus, the oscillation wavelength as a laser light source can be changed over a wide band. In addition, injection currents If and Ir of two semiconductor lasers 31 and 32 constituting the $C^3$ laser 30 are controlled by a control circuit not shown, and thus, the oscillation wavelength can be finely adjusted.

Further, in the case where the laser light source is constituted by the first and second external cavities, the external cavity lengths L1 and L2 of two external cavities are substantially equal to each other as has been described above, and therefore, the wavelength cycle in which an injection synchronization mode (or vernier mode) in which equal cavity modes are generated can be wide.

As a result of this, adjacent vernier modes can be set, beyond the limits of the wavelength resolution of the diffraction grating 34, so that the side mode suppression ratio (SMSR) can be maximized.

(3) A mutual optical injection-locking light source

A mutual optical injection-locking light source as shown in FIG. 8 is disclosed in Jpn. Pat. Appln. KOKAI Publication No. 7-106710, a first external cavity laser 44 is formed between a semiconductor laser (LD1) 41 in which one output end surface is provided with an AR coating to form an AR coating surface 41a, and a reflection mirror 43 provided on the AR coating surface 41a so as to oppose the AR coating surface 41a with a collimating lens 40 interposed therebetween.

In addition, a second, external cavity laser 45 is formed between a reflection surface 41b formed on the other end surface of the semiconductor laser 42 where no AR coating is provided, and a high reflection surface 42b formed on the other end surface of the semiconductor laser (LD2) 42 in which an AR coating surface 42a is formed on one end surface of the laser 42, with a pair of collimator lenses 40 are interposed between the reflection surfaces.

Further, this kind of mutual optical injection-locking light source utilizes a phenomenon that the light independently oscillated by the first external cavity laser 44 and the light independently oscillated by the second cavity laser 45 are mutually injected in their own cavity (shown in FIGS. 9A and 9B), thereby starting synchronized oscillation of a synchronized frequency.

The synchronized oscillation occurs when the difference in wavelength between the first and second external cavity lasers 44 and 45 oscillating independently from each other is within a synchronization range (or a locking range).

The synchronization range $\Delta v0$ of one single laser light source is expressed as follows.

$$\Delta v0 = \{1/(4\pi\tau p)\}\{Pin/P1\}^{1/2} \quad (1)$$

Here, $\tau p$ is a photon lifetime, Pin is an injected light power, and P1 is a light power inside a cavity.

Further, the synchronization range of the mutual optical injection-locking light source is expressed as a sum of the synchronization ranges $\Delta v1$ and $\Delta v2$ which are calculated independently from each other with respect to the first and second external cavity lasers 44 and 45.

In the state where the synchronization occurs, the oscillation gain close to the oscillation wavelength is suppressed. Therefore, if two cavity lengths are changed and the wavelength is swept with maintaining the state generating the mutual optical injection-locking (i.e., the state in which the vernier mode is generated) (as shown in FIG. 9C), it is possible to perform wavelength sweeping of a continuous phase.

In this case, even if the mechanical precision is low with respect to changes in cavity lengths, in correspondence of the mode wavelengths within a synchronization range or so is allowable, and therefore, assembly of a laser light source apparatus as a whole can be easily facilitated.

In addition, in this light source, since the injection light has an effect of increasing the Q value of oscillation, it is possible to obtain oscillation light having a high side mode suppression ratio.

However, the above three types of tunable wavelength laser light source apparatuses have the following problems.

(1) The external cavity laser light source apparatus described as prior art has the following problem.

Specifically, in order to obtain a wavelength variable range of a wide band (e.g., 100 nm), a rotation range of about 10° is necessary as a rotation angle of the diffraction grating. However, a PZT element which can be electrically controlled ensures only a dynamic range insufficient for obtaining the rotation, and therefore, an actuator such as a stepping motor or the like must be used.

However, an actuator which generally has a large dynamic range cannot provide sufficient setting resolution and reproducibility, so that the light source using this actuator has a wavelength setting resolution limited to 0.1 nm.

In addition, the optical cavity modes establish every a free spectrum range (FSR) expressed as follows.

$$FSR = \lambda^2/2nl \quad (2)$$

Here, $\lambda$ is a light wavelength, n is a refraction index, and l is a cavity length.

Therefore, if the external cavity is constituted with use of a diffraction grating, the cavity length l is long, so that the modes establish with a high density.

Meanwhile, the wavelength resolution of diffraction grating $\Delta\lambda$ is expressed by the following equation.

$$\lambda/\Delta\lambda = N \times W \quad (3)$$

Here, $\lambda$ is a wavelength of an incidence light, N is the number of grooves per 1 mm, and W is the length of an irradiation area on the diffraction grating surface relating to diffraction.

For example, where the cavity length is 40 mm, the wavelength is 1.55 µm, and the groove pitch of the diffraction grating is 1100 line/mm, and the light spot diameter is 2.5 mm, the FSR and the resolution of the diffraction grating are respectively 30 pm and 270 pm from calculations.

If this relationship is applied to FIG. 6B, the wavelength resolution of the diffraction grating is decided by the grating discrimination curve, and includes several modes of the external cavity.

Therefore, the diffraction grating cannot dissolve one cavity mode, and an apparent difference in reflection ratio does not appear between an oscillation mode and a mode adjacent thereto, so that the side mode suppression ratio cannot be set to be high.

In addition, it is not possible to control which of the modes existing within the range of the resolution causes oscillation. Consequently, an instability of oscillation mode occurs.

This instability of oscillation mode is a factor which causes degradation in setting wavelength resolution and reproducibility of the oscillation wavelength of the entire light source.

Further, the AR coating provided on an end surface of the semiconductor laser generally has a reflectivity of about $10^{-3}$. However, in order to eliminate influences from the cavity mode (or internal mode) inside the semiconductor laser, a reflectivity of $10^{-4}$ or less is required.

Therefore, in the case where a light source is prepared by providing a conventional AR coating on an end surface of the semiconductor laser, the wavelength jumps between internal modes, therefore the light source has a wavelength area where oscillation is impossible.

(2) The semiconductor laser light source apparatus described as prior art further includes the following problem, in addition to the problem of the rotation mechanism of the diffraction grating and the problem of the setting wavelength resolution.

Specifically, this light source apparatus is based on a 4-mirror system, phase mismatching occurs at a cyclic wavelength position, due to an air gap between semiconductor end surfaces formed by creeping, so that a jump of an oscillation wavelength is caused like an instability of the oscillation mode and incompleteness of the AR coating.

Further, in this light source apparatus, a fine adjustment is performed on the oscillation wavelength, with use of an injection current. However, since this light source apparatus has an external cavity structure, the optical cavity length is long so that changes in optical distances caused by injection currents are very small in relation to the optical cavity length. Therefore, there is a problem in that the fine adjustment range of the wavelength is small.

(3) In the mutual optical injection-locking light source described as prior art, a synchronization range Δv0 decided by the injected light power amount occurs, as indicated by the equation (1).

This value greatly changes, depending on the phase conditions of light to be coupled.

This change is expressed as follows.

$$\Delta v = \{\Delta v0 (M^2 + 2M \cos \beta + 1)^{1/2}\}/(M+1) \quad (4)$$

where Δv1 and Δv2 are synchronization ranges independently generated by two external cavity lasers, M is (Δv1/Δv2), Δv0 is (Δv1+Δv2), and β is a relative phase difference of coupled light.

Therefore, the synchronization range, is wide, and therefore, it is possible to perform sweeping even if the mechanical precision is low with respect to the mode sweeping of the cavity. However, there is a problem in that a mechanical swing causes a swing of the synchronization range, so that the synchronization state is unstable.

SUMMARY OF THE INVENTION

It is, therefore, an object of the present invention to provide a new and improved tunable wavelength laser light source apparatus which can solve the problems described above and which has a high wavelength resolution, a high mode stability, a narrow spectral line width, and a high side mode suppression ratio, so that laser light can be oscillated over a wide wavelength band.

According to an aspect of the present invention, there is provided a laser light source apparatus comprising a compound cavity and an optical gain medium, the compound cavity including first, second, and third optical reflection members disposed along an optical axis, wherein the first optical reflection member has a light wavelength selectivity, at least one of the first to third optical reflection members can change its own position on an optical axis in relation to the other reflection members, two of the first to third optical reflection members are provided opposite to each other with the optical gain medium inserted therebetween, thereby forming a laser light source, and the other one optical reflection member is provided so as to form a light path for feeding laser light emitted from the laser light source back to the laser light source.

According to another aspect of the present invention, there is provided a laser light source apparatus comprising: compound cavity; and first and second optical gain mediums, the compound cavity including of first, second, and third optical reflection members disposed along an optical axis, wherein the first optical reflection member has a light wavelength selectivity, at least one of the first to third optical reflection members can change its own position on an optical axis in relation to the other reflection members, two of the first to third optical reflection members are provided opposite to each other with the first optical gain medium inserted therebetween, thereby forming a laser light source, and the other one optical reflection member is provided so as to form a light path for feeding laser light emitted from the laser light-source, through the second optical gain medium, back to the laser light source.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the present invention.

FIGS. 3A, 3B, and 3C are views showing compound cavity, an optical cavity mode, and a compound cavity mode, respectively, and explaining the operation of the first embodiment of the present invention;

FIGS. 4A, 4B, and 4C are views showing an optical cavity mode, a compound cavity mode, and a discrimination curve of the diffraction grating, respectively, and explaining the operation of the present invention;

FIG. 8 is a view schematically showing the structure of a mutual optical injection-locking light source as a prior art example;

FIGS. 9A, 9B, and 9C are views respectively showing a first external cavity mode, a second external optical cavity mode and an oscillation mode, for explaining the operation of a mutual optical injection-locking light source as a prior art example;

DETAILED DESCRIPTION OF THE PREFERRED EMBODIMENTS

Figure 1:
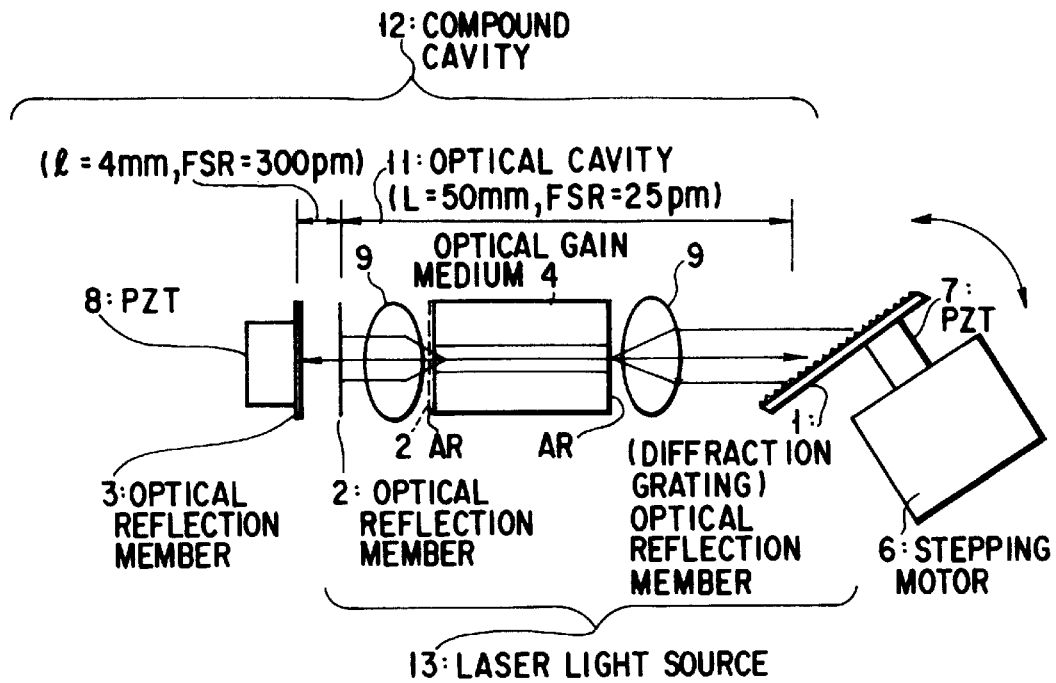
FIG. 1 is a view schematically showing the structure of a first embodiment of the present invention.

Reference will now be made in detail to the presently preferred embodiments of the present invention as illustrated in the accompanying drawings, in which same reference characters designate same or corresponding parts throughout several drawings.

At first, the present invention will be summarized.

In order to solve the problems of the prior art techniques as described above, in the first embodiment of the present invention, a compound cavity laser is constituted by one optical amplification medium (called an optical gain medium), and three mirrors or optical reflection members.

One of the three mirrors uses an optical reflection member having a wavelength selectivity such as a diffraction grating or the like.

This compound cavity is characterized in that positions of the mirrors relative to each other are decided so that only one cavity mode exists in the wavelength resolution of the diffraction grating.

According to this compound cavity, an optical gain medium is inserted between first and second optical reflection members facing each other, thereby forming a laser oscillator.

Like conventional laser oscillation, the oscillation mode of this laser oscillator is a multi-mode in which oscillation of a plurality of wavelengths is obtained, as shown in FIG. 3B.

A part of the output from this laser oscillator is reflected by the third optical reflection member, and is then, fed back to to the laser oscillator.

Figure 2:
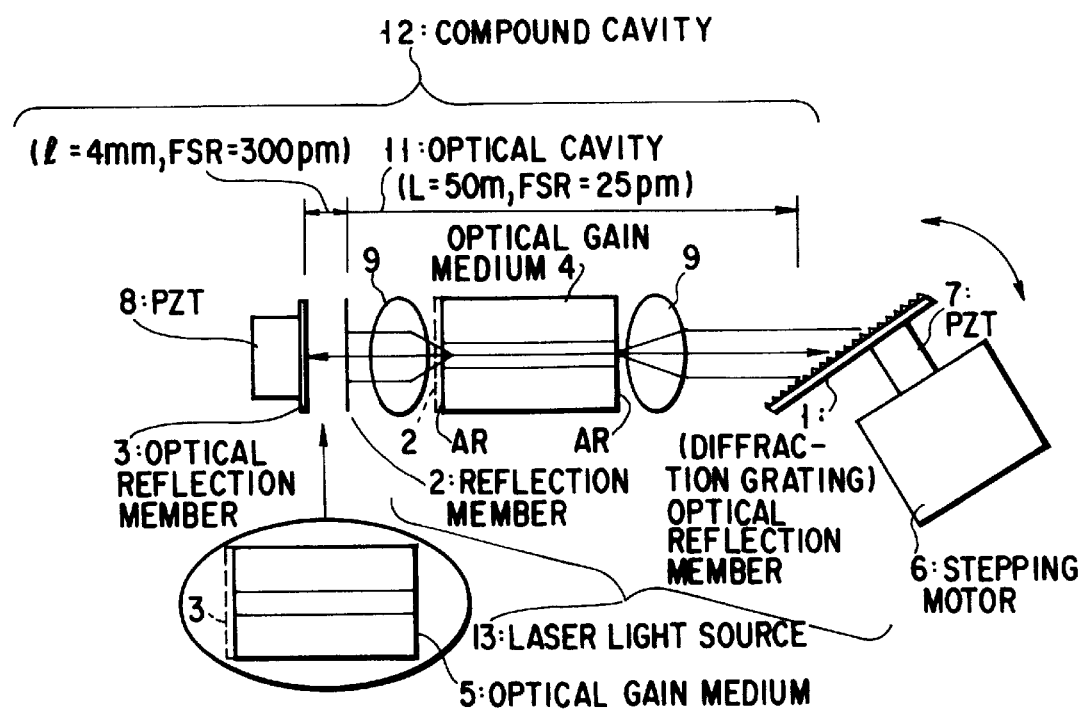
FIG. 2 is a view schematically showing the structure of a second embodiment of the present invention.

According to the structures shown in FIGS. 1 and 2, the third optical reflection member is arranged such that positions can be adjusted along the optical axis, and the oscillation mode emphasizes the oscillation of modes standing at a particular wide wavelength interval among multi-modes, by the optical feedback.

The emphasized mode is called a compound cavity mode.

Further, one of the three optical reflection members is, for example, a rotating diffraction grating which has a wavelength selectivity, and therefore, a small number of modes (or preferably one mode) are selected among a plurality of compound cavity modes.

In addition, in the present invention, by a mechanism which finely changes the distances between the third optical reflection member and laser oscillator, the structure is arranged such that modes of the compound cavity can be swept in relation to wavelengths. Further, in the second embodiment of the present invention, a second optical amplification medium separately provided is provided within a gap between two reflection members, and is made to operate as an optical amplifier.

The compound cavity system in the present invention is prepared, based on a hint from a mutual injection-locking light source disclosed in Jpn. Pat. Appln KOKAI Publication No. 7-106710, prepared by the inventor of the present invention, as shown in FIG. 8.

In this Japanese Patent Application, the first and second semiconductor lasers are positioned with the optical axes thereof aligned with each other, and an external cavity is constituted by an end surface of the first semiconductor laser provided with no anti-reflection coating and an end surface of the second semiconductor laser provided with no anti-reflection coating. A cavity length variable means (not shown in FIG. 8) and a signal source (not shown in FIG. 8) for setting a wavelength are controlled to realize a tunable wavelength light source apparatus.

In contrast, the laser light source apparatus according to the present invention is prepared on the basis of a hint from a laser light source apparatus utilizing a mutual optical injection-locking phenomenon, and is characterized in that the laser light source apparatus uses a function of a compound optical cavity, to realize a tunable wavelength light source which is capable of oscillating over a wide wavelength band and which attains a narrow spectral line width and a high side mode suppression ratio (SMSR).

The following will explain specific embodiments of the present invention based on the summary as described above.

FIGS. 1 and 2 are respectively views schematically showing structures of first and second embodiments.

To see the first embodiment as shown in FIG. 1, three optical reflection members 1, 2, and 3 are disposed along an optical axis.

The optical reflection member 1 is formed of a diffraction grating, and is rotated by a PZT 7 and a stepping motor 6, as indicated by an arc-like bi-directional arrow, so that a wavelength of reflection light can be selected.

An optical gain medium 4 exists between the optical reflection members 1 and 2.

Both ends of the optical gain medium 4 are provided with anti-reflection coatings.

In addition, optical elements (or collimating lenses) 9 and 9 such as convex lenses are appropriately provided in both sides of the optical gain medium, so that a laser light source 13 is constituted by optical reflection members 1 and 2 and an optical gain medium 4.

This laser light source 13 utilizes an optical cavity 11 manufactured by the optical reflection members 1 and 2.

The optical cavity 11 has, for example, a length L of 50 mm and an FSR of 25 pm.

As the optical gain medium 4, for example, a semiconductor laser using InGaAsP, GaAlAs, or the like can be used.

Further, a part of light from the laser light source 13 passes through an optical reflection member 2 made of a half-mirror or the like, and is sent to the outside. Then, the light is reflected by an optical reflection member 3 provided on the optical axis and returns to the optical cavity 11 of the laser light source 13.

The distance l between the optical reflection members 3 and 2 is 4 mm which is shorter than the length L=50 mm of the optical cavity, and the light fed back is coupled in phases with the light inside the laser light source 13, at an interval of 300 pm.

The above is the reason why the apparatus of the present invention is referred to as a compound optical cavity, or simply a a compound cavity.

In addition, the optical reflection member 3 can changes its position on the optical axis by means of the PZT 8, so that the apparatus of the present invention becomes a tunable wavelength light source.

Note that the compound cavity using a semiconductor laser in the present invention is referred to as a CCSL (compound cavity semiconductor laser).

In the next, the structure of the second embodiment shown in FIG. 2 is different from the structure of FIG. 1 described above, in that a second optical gain medium 5 is inserted on the light path of the optical reflection members 3 and 2.

FIG. 2 illustrates an optical gain medium 5 outside the optical reflection members 3 and 2, for convenience, since it is difficult to draw the medium 5 on the light path of the optical reflection members 3 and 2, in this figure.

FIGS. 3A, 3B, and 3C are functional views showing the operation of the structure shown in FIG. 1.

Oscillation light (having a phase φ) outputted from the cavity 11 constituted by the optical reflection members 1 and 2 (although the wavelength selectivity of the optical reflection members are not yet taken into consideration) is reflected by the optical reflection member 3 and is fed back to the optical cavity 11.

Therefore, the optical reflection member 3 is a feedback mirror, and light is fed back to the optical cavity 11, with its phase changed by Δφ between the forward light path and the backward light path.

Normally, when an angle of Δφ is π, the oscillation wavelength of the laser light source 13 is emphasized.

This state is shown in FIG. 3C.

Specifically, in the laser light source 13 consisting of only the optical reflection members 1 and 2 and the optical gain medium 4, multi-mode oscillation is observed in the mode shown in FIG. 3B. However, since a feedback mirror (i.e., the optical reflection member 3) is provided, it is possible to obtain a compound cavity mode called in the present invention, in which the oscillation gain at intervals.

FIGS. 4A, 4B, and 4C take into consideration a case in which the optical reflection member 1 is provided with a wavelength selectivity like a diffraction grating.

Specifically, in the discrimination curve of the diffraction grating, when the full width at the half maximum is 300 pm as shown in FIG. 4C, the multi-mode oscillation having a plurality of compound cavity modes changes into a single mode oscillation having one compound cavity mode selected by a diffraction grating.

The operations of the first and second embodiments of the present invention shown in FIGS. 1 and 4A, 4B, and 4C will be as follows.

The mode of the compound cavity of the present invention constituted by three mirrors, i.e., optical reflection members 1, 2, and 3 is generated in such a manner in which an electromagnetic mode consisting of two adjacent mirrors, i.e., optical reflection members 1 and 2 is coupled on phases with a reflection electromagnetic field from another mirror (or feedback mirror), i.e., the optical reflection member 3.

Therefore, the compound cavity mode is excited more strongly as an electromagnetic field amplitude than the mode which the optical cavity 11 originally has.

If an optical amplification medium 4 is provided inside the optical cavity 11 and is constituted as a laser light source (or oscillator) 13, oscillation has a higher gain at a wavelength where the compound cavity mode stands, and therefore, the oscillation mode which the optical oscillator originally has is suppressed, while the compound cavity mode starts oscillation.

The present invention is characterized in that the apparatus has such an operation mode.

This compound cavity mode is generated at a wavelength cycle decided by the light path length 1 between the optical cavity 11 and a feedback mirror 3 which feeds back light to the optical cavity 11. (The wavelength cycle can be calculated by substituting the cavity length l of the equation (2) with the light path length l).

In order to select one single compound cavity mode existing at an arbitrary wavelength position and to generate oscillation, the light path length l must be decided by the wavelength resolution of the diffraction grating 1.

For example, if the wavelength resolution ability is 270 pm, the light path length l is set to less than 4 mm, and the wavelength interval of the compound cavity mode is set to more than 270 pm.

By thus setting the light path length l, one single compound cavity mode is generated within the wavelength resolution of the diffraction grating 1, so that stable single mode oscillation can be obtained.

In addition, this state is different from the state in which a number of modes exists within a range of a resolution of the diffraction grating as described with respect to the external cavity laser of the prior art technique. The oscillation wavelength of the compound cavity laser is not decided by the reflection center wavelength of the diffraction grating, but is decided by the compound cavity mode.

Therefore, even when the fluctuation of the wavelength setting due to the rotation mechanisms 6 and 7 of the diffraction grating is about 0.1 nm, the compound cavity mode exists at a distance of the setting wavelength fluctuation or more (e.g., 0.2 nm), and therefore, the compound cavity mode can be sufficiently selected. If the mode interval of the optical cavity 11 is sufficiently narrow, the factor which decides the wavelength setting resolution of the compound cavity laser is the PZT element 8 of a high precision which controls the wavelength of the compound cavity mode (or which decides the position of the feedback mirror 3).

Therefore, in the present invention, it is possible to realize a light source having a high setting resolution of about 10 pm.

In addition, viewed from the laser light source 13, the optical reflection members 2 and 3 can be considered as one reflection member having a reflection index dependent on the wavelength.

The change in reflection index has a characteristic that the greatest value is obtained at the compound cavity mode, and the smallest value is obtained at a middle wavelength of the compound cavity mode.

Therefore, in comparison with the external cavity laser of the prior art technique, the difference in reflection index between the oscillation mode and an adjacent optical cavity mode is large, so that the side mode suppression ratio (SMSR) can be improved.

Further, as can be seen from the above numerical example, in the compound cavity laser, the light path length between the optical cavity 11 and the feedback mirror 3 is set to be short, and therefore, the compound cavity mode can be subjected to wavelength sweeping by several tens nm, even with a PZT element having a dynamic range of about several tens μm, so that a fine adjustment range can be ensured for a wide band.

Meanwhile, the compound cavity laser can be considered as a light source having a self-injection locking system as follows.

Specifically, laser light emitted from the optical cavity 11 is reflected by the feedback mirror 3, and is injected into the optical cavity 11, again. This system is called a self-injection locking system.

The characterizing operation of the self-injection locking system is a phenomenon in which the oscillation wavelength of the optical cavity is pulled into the optical wavelength corresponding to the optical phase of the feedback laser light.

This phenomenon will be explained with reference to FIG. 11.

Figure 11:
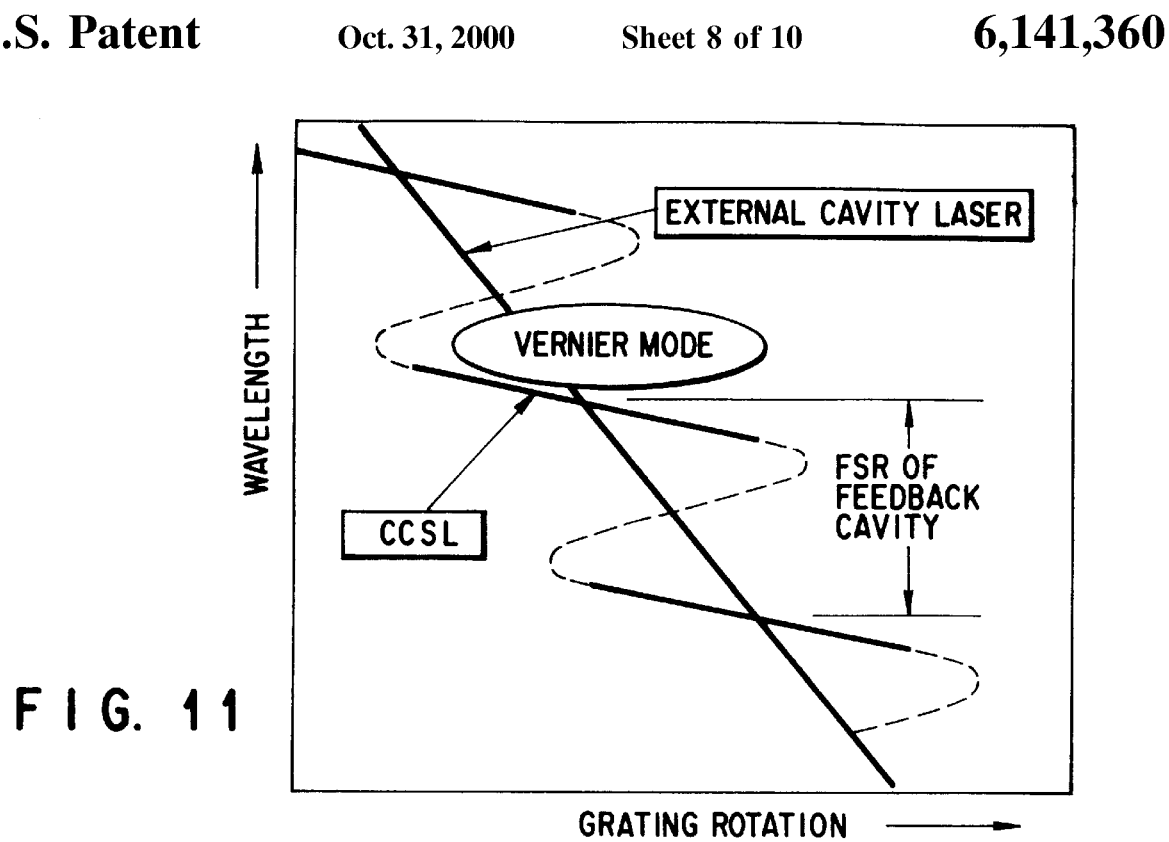
FIG. 11 is a graph for explaining the stability of oscillation of the compound cavity mode by means of the present invention.

FIG. 11 shows the rotation amount of the diffraction grating in the lateral axis in arbitrary units, which the longitudinal axis indicates the oscillation wavelength of the single cavity mode which changes in accordance with rotation of the diffraction grating.

In case of an external cavity laser, the wavelength of the mode changes linearly in accordance with rotation of the diffraction grating, as indicated by the line in the figure.

Meanwhile, in a compound cavity laser (CCSL), the wavelength of the mode changes like a sine wave, under influences from the self-injection locking, as shown in FIG. 11.

In this state, in the broken line portion of the sine wave, the electric field in the laser cavity is opposite to the phase of the electric field of the feedback laser, and oscillation is suppressed.

Therefore, in case of a compound cavity laser, oscillation can be obtained only in the portion indicated by a continuous line among the wavelength change curve of the sine wave, and this portion constitutes the compound cavity mode.

As can be seen from the change characteristic of the compound cavity mode, the wavelength change amount when the rotation amount of the diffraction grating is fluctuated by changes in the outer environment can be reduced to be smaller in comparison with an external cavity laser, since the rate of the wavelength change is small in relation to the rotation of the diffraction grating of the compound cavity mode.

Therefore, in a light source having the structure of the present invention, the stability of the oscillation wavelength is dependent on the position stability of the feedback mirror. If the feedback mirror is fixed to a solid element such as a PZT element 8 or the like, as shown in FIGS. 1 and 2, the position stability can be ensured and the oscillation wavelength stability as a light source is improved.

Meanwhile, as the amplitude of the sine wave shape in the compound cavity laser is increased, the change in wavelength with respect to the fluctuation of diffraction grating is decreased, so that the wavelength stability is improved.

The amplitude of the sine wave is increased in proportion to $(Pin/Pi)^{1/2}$.

Here, Pin is a light power injected into the optical cavity 11, and Pi is a light power inside the optical cavity.

Therefore, the wavelength stability is improved as the Pin fed back is increased. However, this value is limited by coupling losses or the like of light due to the feedback light path.

To improve this state, an optical amplification gain medium 5 is inserted between the optical cavity 11 and the feedback mirror 3.

In this structure of the light source, losses on the feedback light path are compensated for, and further, amplified laser light can be fed back to the optical cavity 11.

In this manner, a very high stability can be realized as a light source, and the position of the feedback mirror decides the wavelength of the entire light source, in wavelength sweeping with use of a PZT element 8, so that artificial wavelength continuous sweeping can be realized.

Figure 5A:
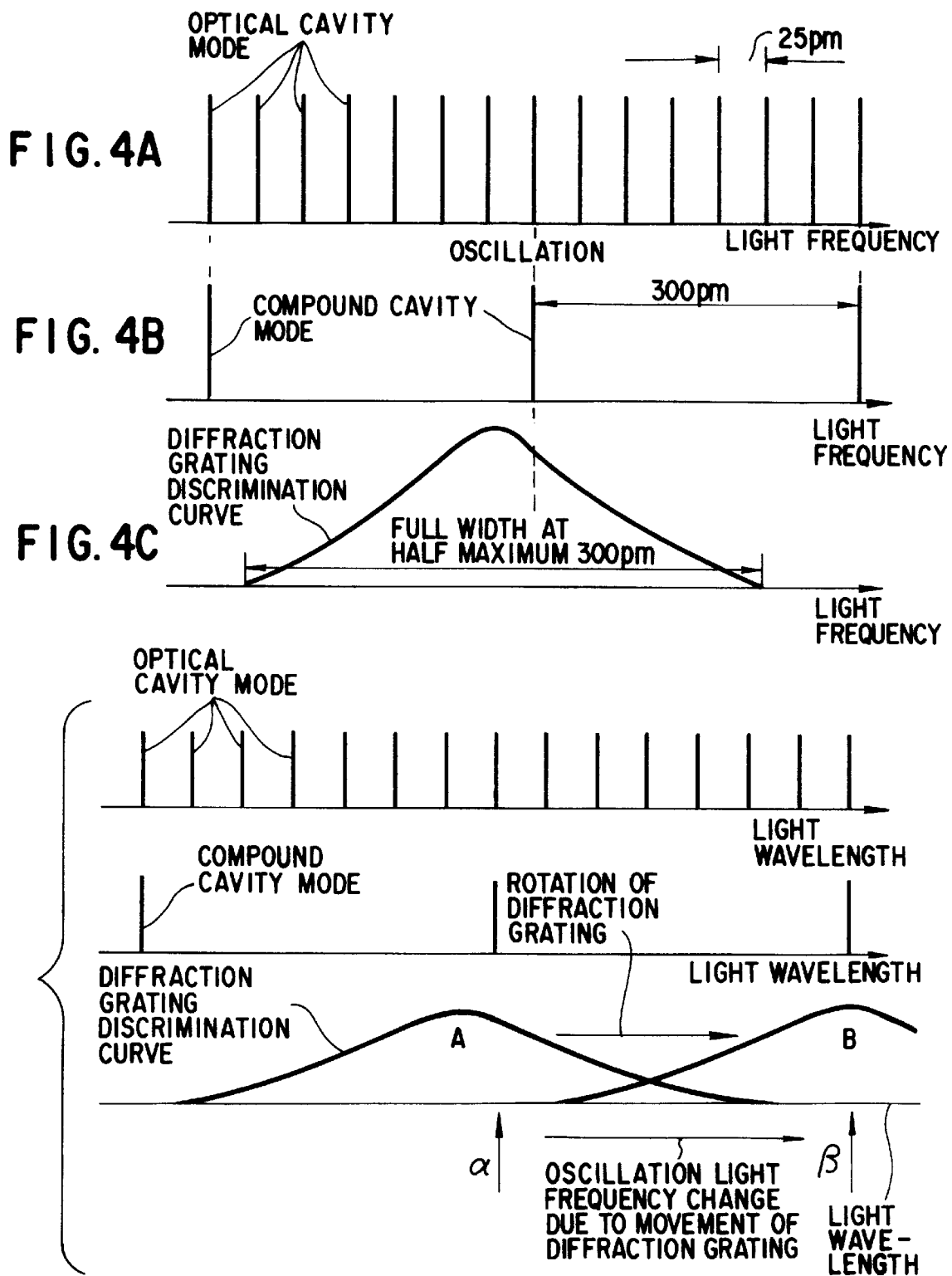
FIGS. 5A, 5B, and 5C are views showing coarse adjustment operation, fine adjustment operation, and continuous wavelength sweeping operation.
Figure 5B:
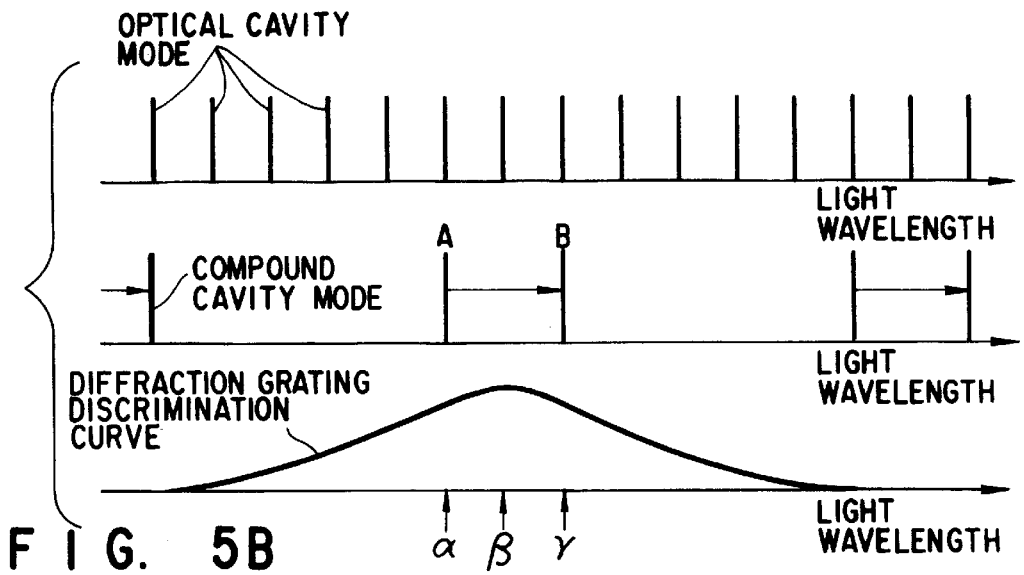
Figure 5C:
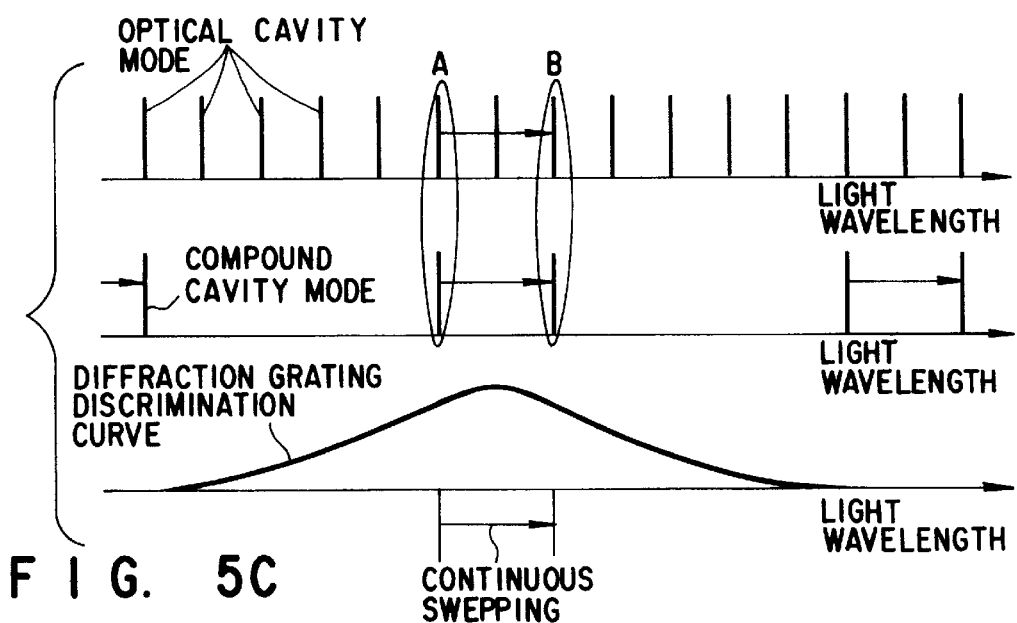
Figure 6A:
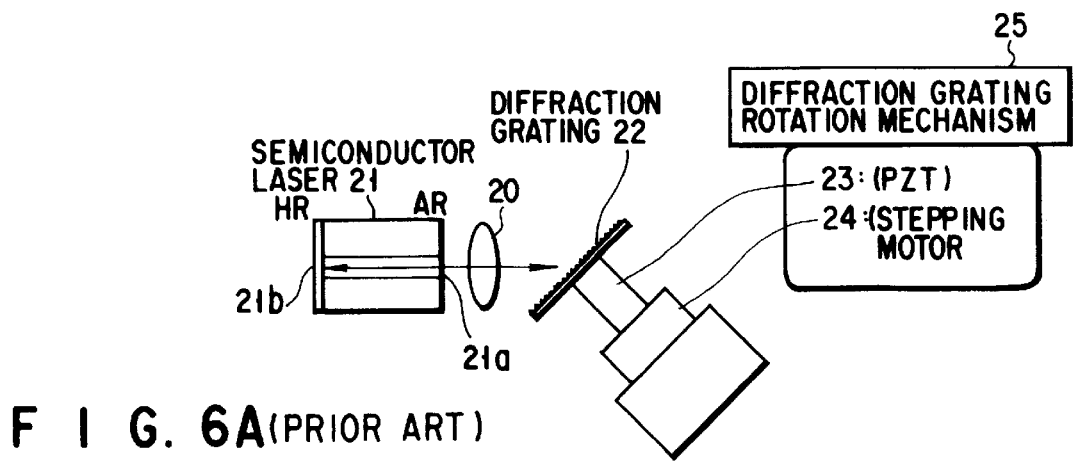
FIGS. 6A and 6B are views showing a schematic structure of an external cavity laser as a prior art example, and a relationship between the external cavity mode and the wavelength resolution of the diffraction grating of the example, to explain the external cavity laser.
Figure 6B:
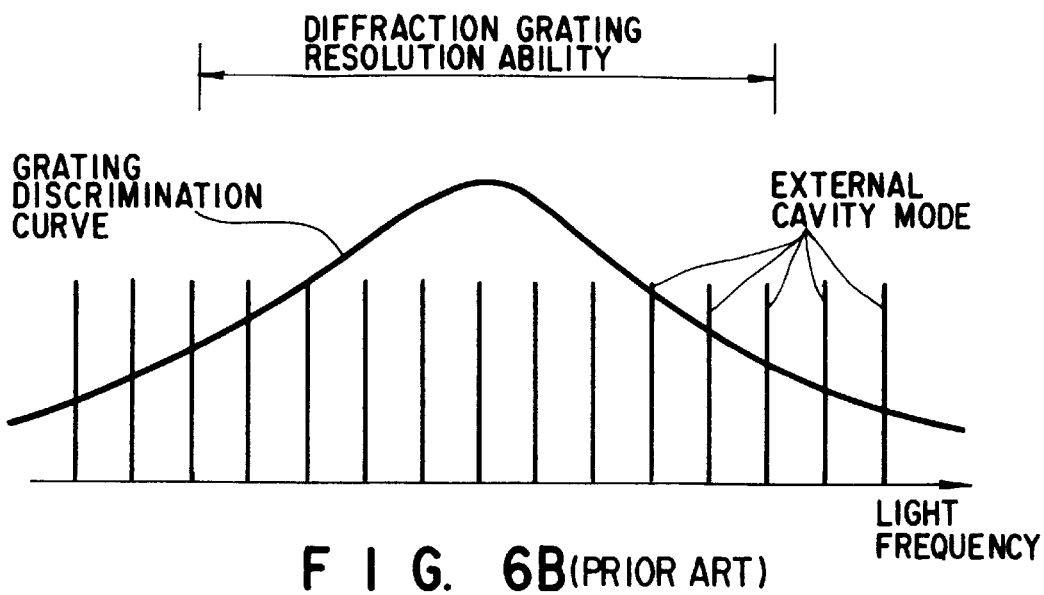
Figure 7A:
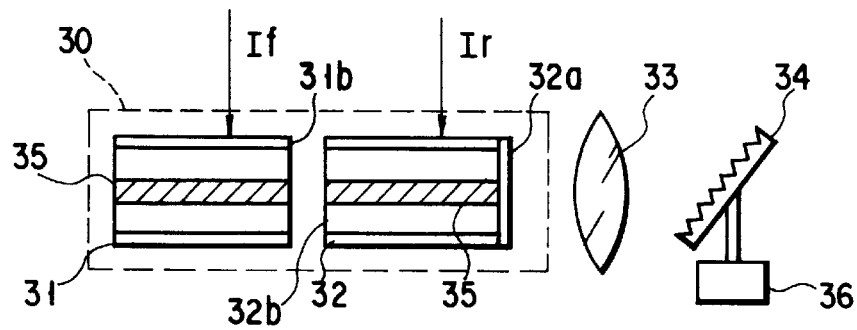
FIGS. 7A and 7B are views schematically showing the structure of a semiconductor laser apparatus as a prior art example.
Figure 7B:
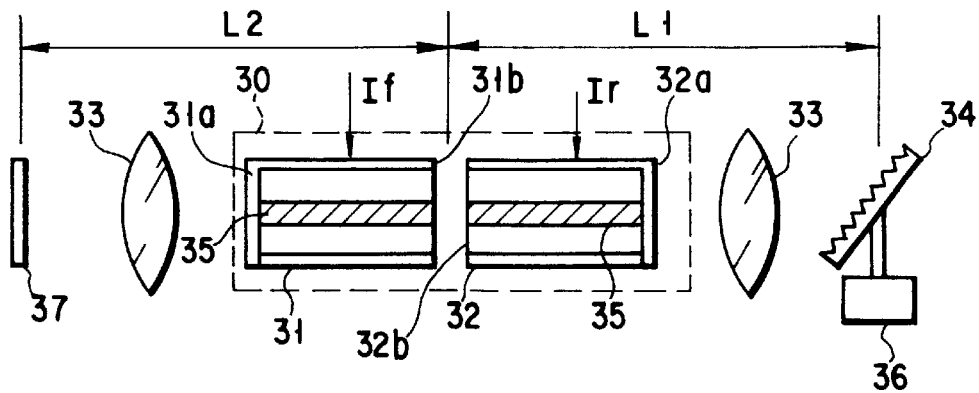

With reference to FIGS. 5A, 5B, and 5C, explanation will be made to a case where wavelength sweeping operation is performed in order that the laser light source having the compound cavity structure according to the present invention as shown in FIGS. 1 and 2 performs tunable wavelength operation.

This wavelength sweeping operation is controlled by three control manners, i.e., control of coarse adjustment sweeping operation, control of fine adjustment sweeping operation, and control of continuous wavelength sweeping operation.

FIG. 5A is a view showing an example of a coarse operation.

Specifically, in FIG. 5A, a discrimination curve of the diffraction grating 1 exists at A in an initial state, and the oscillation light wavelength in this state is at the position of the compound cavity mode a included in the curve.

From this state, the diffraction grating 1 is rotated so that the diffraction grating discrimination curve is moved from A to B. In accordance with the movement of the discrimination curve, the gain of the next compound cavity mode existing in the moving direction is gradually intensified, so that the oscillation frequency jumps from the position a to the position β.

The compound cavity mode interval is a relatively wide optical wavelength interval of several hundreds pm. If the diffraction grating is rotated at a large angle, coarse sweeping can be performed at the interval of the compound cavity mode, over a wavelength range of about one hundred nm.

FIG. 5B is a view showing an example of fine adjustment operation.

In this case, a coarse oscillation light wavelength is set at a resolution of several hundreds pm in FIG. 5A, and thereafter, the vicinity of the oscillation light wavelength is used to set a wavelength with a resolution of several tens pm.

In this case, the position of the feedback mirror 3 is changed in the optical axis direction, with the diffraction grating 1 fixed, thereby moving the position of the compound cavity mode within the full width at hart maximum of the discrimination curve of the diffraction grating 1.

FIG. 5B shows a state in which the compound cavity mode is changed from A to B.

The light source of the present invention selects an optical cavity mode in which the compound cavity mode oscillates, and therefore, the compound cavity mode selects three cavity modes of α, β, and γ at any time, in case of FIG. 5B, so that a wavelength jump at an interval of several tens pm is repeated to set the wavelength sweeping.

Note that the width of the wavelength jump can be reduced to be several pm or lower if the feedback light amount is large.

FIG. 5C is a view showing the continuous wavelength sweeping operation.

The coarse adjustment operation and fine adjustment operation described above are wavelength sweeping operations including a jump of a wavelength. In contrast, the continuous wavelength sweeping operation is arranged such that the optical cavity wavelength can be changed. Therefore, if the optical cavity mode is moved in synchronization with the movement of the compound cavity mode depending on the movement of the feedback mirror 3, sweeping without a wavelength jump can be realized.

Also, FIG. 5C shows operation in which continuous sweeping is performed within a wavelength area from A to B, by moving the wavelength oscillating due to overlapping of the optical cavity mode and the compound cavity mode at the wavelength position A, to the position B, while the overlapping of these modes is maintained.

In this case, if the feedback light amount is sufficiently large, the oscillation wavelength of the light source is decided by the wavelength of the compound cavity mode, even when the compound cavity mode does not have a wavelength strictly corresponding to the optical cavity mode.

Therefore, a wide continuous wavelength sweeping range can be obtained according to the present invention if the setting resolution ability and reproducibility for driving the diffraction grating are low.

The three kinds of sweeping operations as described above need not always be operated singly. For example, it is possible to perform wavelength sweeping over a wide band, by combining the case of FIG. 5A with the case of FIG. 5C.

The characterizing feature of the present invention is as follows. In case where the sweeping operation as described above is performed to set the oscillation wavelength to an arbitrary wavelength, the oscillation wavelength is not decided by the center wavelength of the diffraction grating discrimination curve which has a low setting resolution ability, like a conventional light source, but is decided by the compound cavity mode controlled by a PZT or the like whose position can be set with a high accuracy. Therefore, the light source realizes an excellent wavelength reproducibility and a high setting resolution.

The following describes a test in which oscillation of a compound cavity mode was observed while actually using the structure of the present invention.

In this test, the optical reflection member 1 used a diffraction grating having 600 grooves per mm, on the basis of the invention shown in FIG. 2.

This diffraction grating 1 comprised a rotation mechanism consisting of a PZT element 7 and a stepping motor 6, and was constructed in a structure in which the wavelength of the reflection light was variable over a wide band.

In addition, as an optical gain medium 4, a first semiconductor laser made of a compound semiconductor of InGaAsP as material was used with its end surface provided with an AR coating.

Note that, in this test, a reflection member 2 was formed with use of one end surface of the semiconductor laser, as indicated by broken lines in FIGS. 1 and 2, and therefore, the AR coating was provided only on the semiconductor laser end surface opposite to the diffraction grating 1.

Further, in a similar manner, an optical reflection member 3 was constituted with use of an end surface of a second semiconductor laser used as an optical gain medium 5, as indicated by a broken line in FIG. 2.

Therefore, the end surface of the second semiconductor laser which opposes the first semiconductor laser was provided with an AR coating, like the first semiconductor laser.

The positional relationship between the reflection members was arranged such that the optical cavity length formed by the diffraction grating (or the optical reflection member 1) and the end surface (or the optical reflection member 2) of the first semiconductor laser coated with no AR coating was 40 nm and such that the optical distance between the end surfaces (or the optical reflection members 2 and 3) of the first and second semiconductor lasers which were not coated with an AR coating was 13 mm.

Thus, the test condition was as follows.

FSR of optical cavity: 30 pm

Wavelength cycle of compound cavity mode: 90 pm

Resolution of diffraction grating: 2 nm

In this test system, the diffraction grating 1 is rotated while changing the voltage applied to the PZT element 7, and the oscillation wavelength was swept. The results of this test are shown in FIG. 10.

Figure 10:
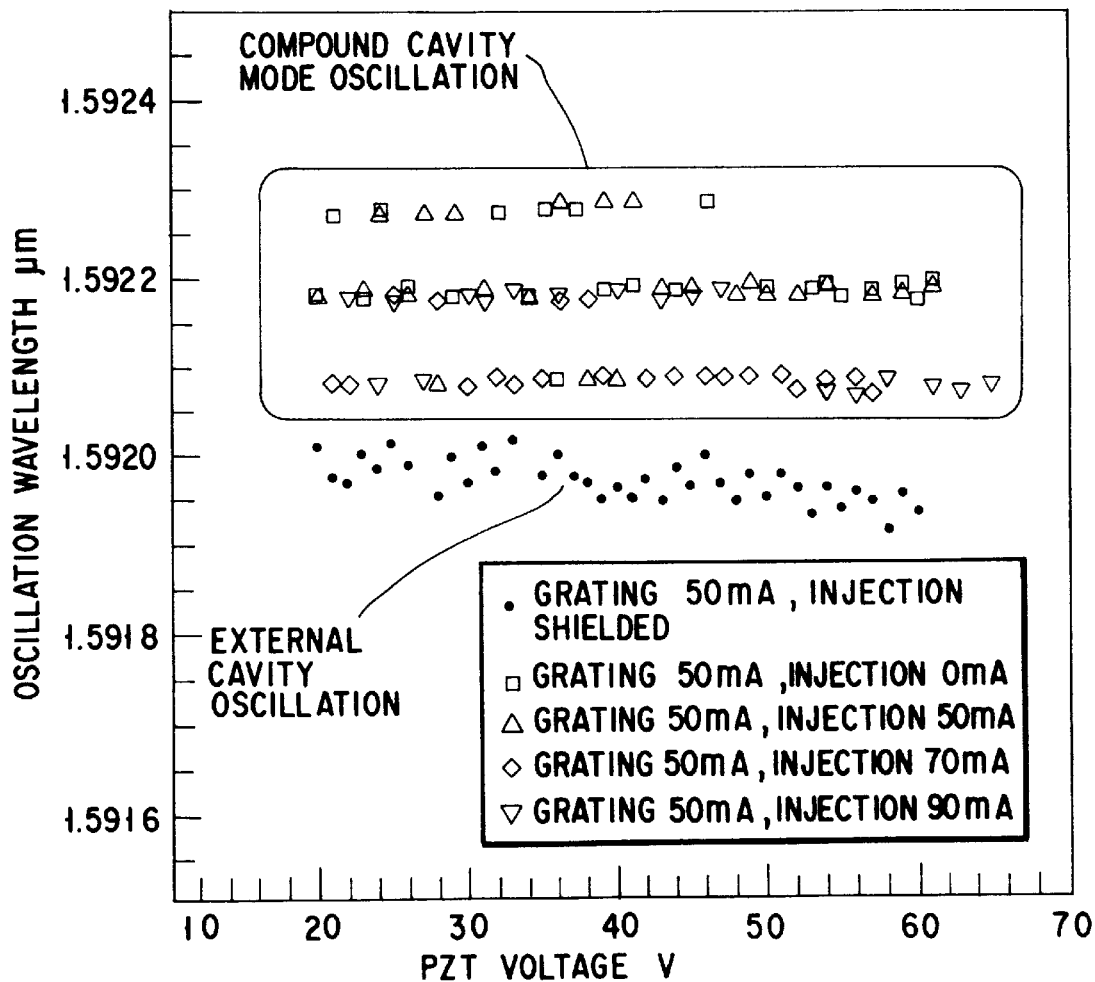
FIG. 10 is a graph showing the results of a test in which oscillation of a compound cavity mode is observed by a laser light source apparatus according to the present invention.

In FIG. 10, black circles represent data where a shielding member was inserted between an optical cavity 11 consisting of optical reflection members 1 and 2 and a feedback mirror (or reflection member 3), to serve as an external cavity laser. White marks represent data where the shielding member was removed, to serve as a compound cavity laser.

As is apparent from FIG. 10, in case where the apparatus was operated as an external cavity, the wavelength is shifted to a short wavelength, finely changing within the wavelength width of about 30 pm, in accordance with the change in the reflection wavelength of the diffraction grating.

This fine change in wavelength occurs on the following grounds. The optical cavity length slightly changes due to rotation of the diffraction grating 1, so that a change in the wavelength of the optical cavity mode due to the change of optical cavity length does not match with a movement of the center of the reflection wavelength of the diffraction grating 1. Therefore, the oscillation wavelength changes to a short wavelength, jumping between close optical cavity modes.

Meanwhile, in case where the apparatus is operated as a compound cavity laser, the oscillation wavelength jumps only between three fixed wavelengths disposed at an interval of 90 pm, and the wavelength is not shifted to a short wavelength due to a change in the reflection center wavelength.

This means that the wavelength position of the compound cavity mode does not change since the position of the feedback mirror 3 is fixed, and that oscillation is not decided by the strict reflection center wavelength of the diffraction grating 1, but is decided by a fixed compound cavity mode.

In this test, in order to confirm that the interval of the compound cavity mode is decided by the setting position of the feedback mirror 3, oscillation was generated at a plurality of compound cavity modes with use of a diffraction grating 1 having a low wavelength resolution. When the resolution of the diffraction grating 1 is high and one single compound cavity mode is selected, one single stable oscillation can be obtained.

This is apparent from the test results using the test system of FIG. 1.

The test condition in this case was as follows.

FSR of optical cavity: 30 pm

Wavelength cycle of compound cavity mode: 200 pm

Resolution of diffraction grating: 300 pm

Here, the number of compound cavity modes included in the resolution of the diffraction grating is substantially one.

Figure 12:
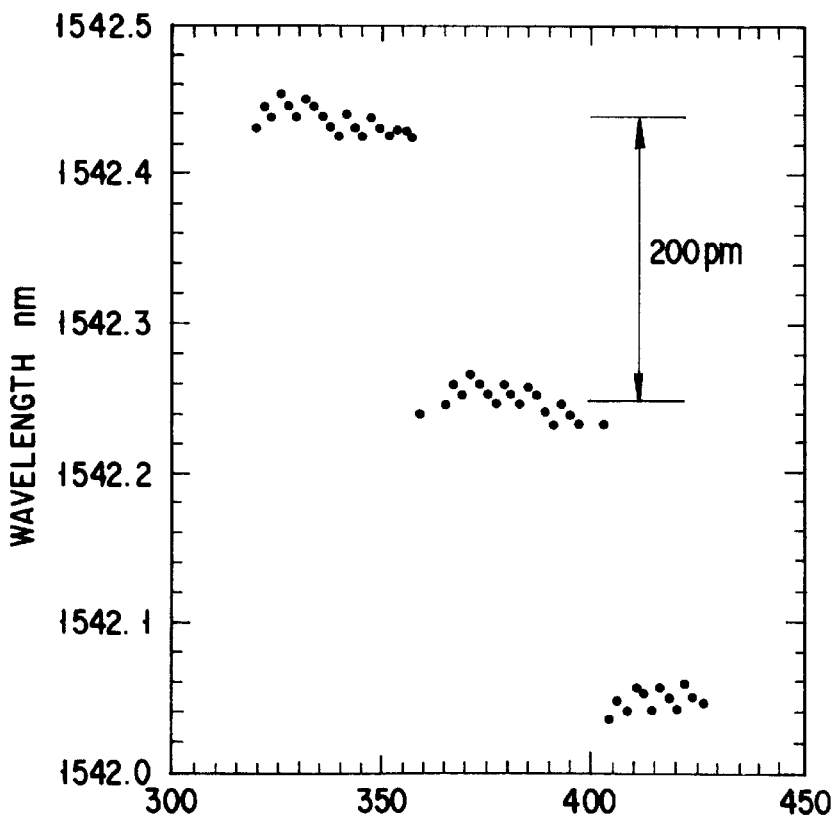
FIG. 12 is a graph showing the wavelength change characteristics when the diffraction grating is rotated in the laser light source apparatus according to the present invention.

FIG. 12 shows the wavelength change characteristic when the oscillation wavelength was changed by rotating the diffraction grating with the position of the feedback mirror fixed.

As is apparent from FIG. 12, compound cavity modes were selected one after another due to rotation of the diffraction grating, while the wavelength changed.

In addition, the oscillation wavelength was substantially constant within a region where oscillation was obtained by one compound cavity mode. Therefore, it is apparent that the apparatus operated as a compound cavity laser.

Figure 13A:
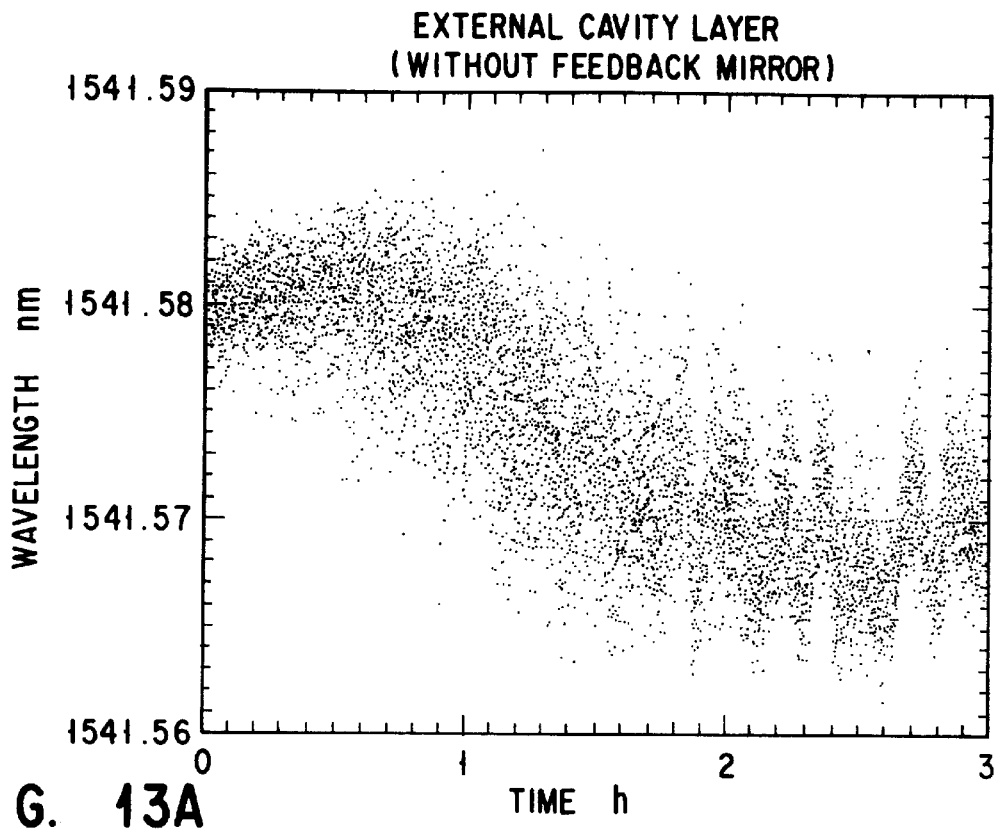
FIGS. 13A and 13B are graphs for comparing the wavelength stability between a case where optical cavity (the external cavity laser light source) singly oscillates and a case where a compound cavity oscillates.
Figure 13B:
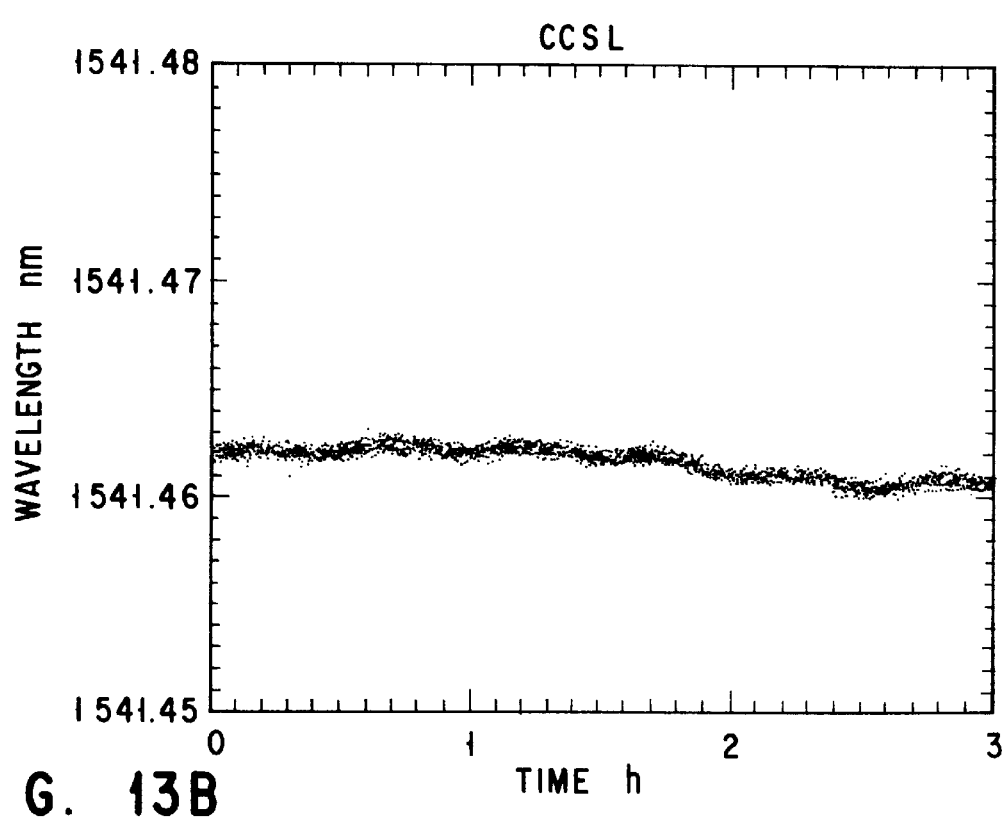

FIGS. 13A and 13B show results in which the wavelength stability for three hours was compared between a case where oscillation is generated singly by an optical cavity with a shielding member inserted between an optical cavity 11 and a feedback mirror (or optical reflection member 3) and a case where oscillation is generated by a-compound cavity.

As is apparent from FIGS. 13A and 13B, the light source (FIG. 13B) according to the present invention reduces the wavelength change width to $\frac{1}{10}$ of a conventional external cavity laser (FIG. 13A), thus attaining a high wavelength stability.

Figure 14A:
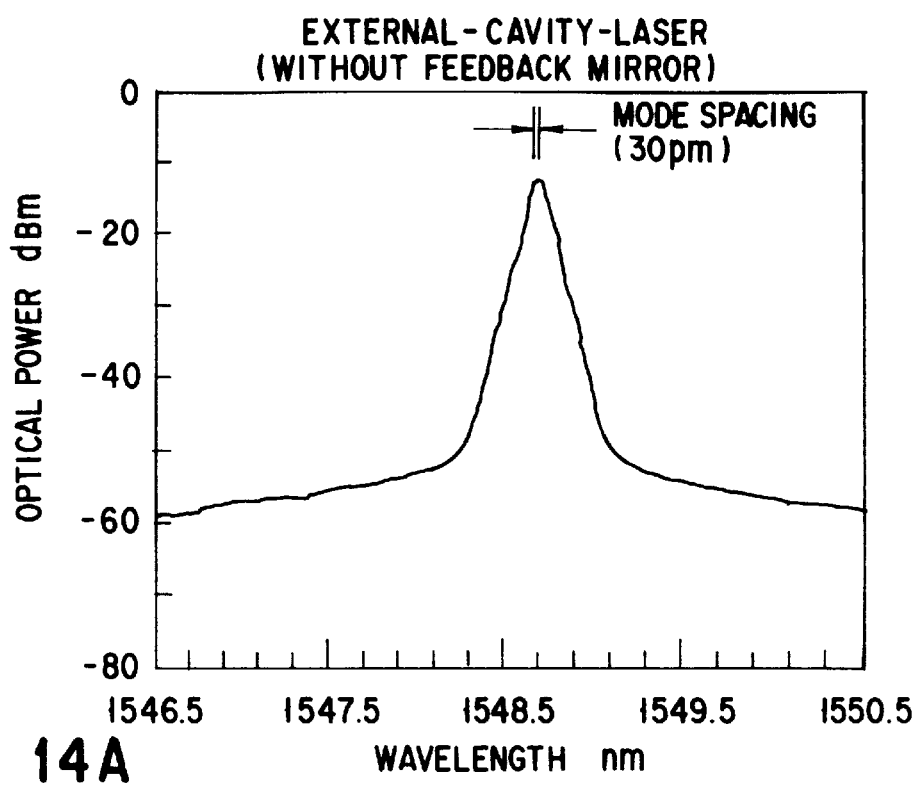
FIGS. 14A and 14B are graphs for comparing SMSR between a case where optical cavity (the external cavity laser light source) singly oscillates and a case where a compound cavity oscillates.

Further, FIGS. 14A and B are graphs showing the observation results in which the state of improvements in SMSR were observed by an optical spectral analyzer having a wavelength resolution of 0.1 nm, with respect to the oscillation profiles in the above state.

Figure 14B:
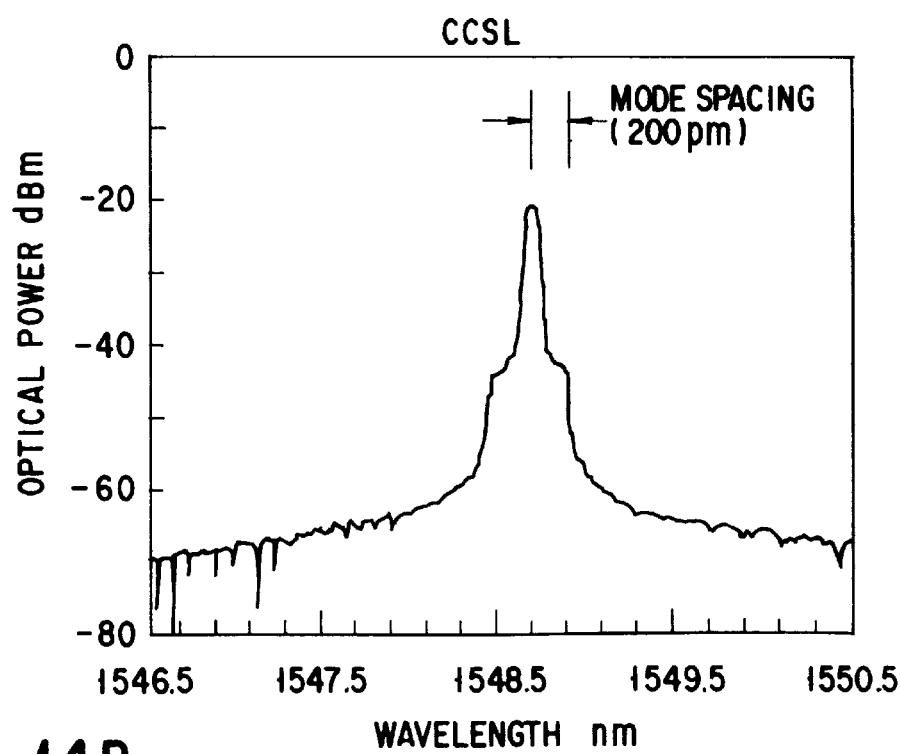

In this case, since the optical cavity mode of 30 pm cannot be resolved, FIGS. 14A and 14B draw envelopes of multimode oscillation.

In case of an external cavity laser (shown in FIG. 14A) of a prior art technique, the SMSR is low and the profile extends loosely like a skirt. In contrast, in case of the present invention (shown in FIG. 14B), the profile sharply projects with a width of the wavelength resolution of the optical spectrum analyzer, since oscillation of the mode of the optical cavity is suppressed thereby improving the SMSR.

The shoulders appearing at both sides represent oscillation of a compound cavity mode positioned apart by 200 pm.

The oscillation of this compound cavity mode can be eliminated by improving the resolution of the diffraction grating, or by setting the position of the feedback mirror much closer to the optical cavity.

This means that the light source according to the present invention basically has a high SMSR characteristic.

In the structures of FIGS. 1 and 2, the optical reflection member 1 is used as a diffraction grating and is provided with a wavelength selectivity, and the position of only the optical reflection member 3 is variable along the optical axis.

However, the relative positional relationship between three optical reflection members is not limited to the embodiments described above.

For example, it is possible to adopt a compound cavity in which the optical reflection member 2 is a filter having a wavelength selectivity with respect to the permeability and the reflection, and is arranged such that the position of the filter can be adjusted.

Also, the optical reflection member 3 having a wavelength selectivity is not only a diffraction grating, but an optical reflection member constituted by a variable wavelength filter and a reflection mirror and a unit constituted by a diffraction grating and a reflection mirror.

As has been described above, the present invention has a structure which comprises a compound optical cavity using three optical reflection members (one of which has a wavelength selectivity and the position of at least one of which can be adjusted on the optical axis), and one or two optical gain mediums inserted between the optical reflection members. Feedback is obtained in consideration of a nonlinearity and a wavelength diffusion between two optical cavities. Therefore, it is possible to provide a laser light source apparatus which has a high wavelength resolution, a high mode stability, a narrow spectral line width, and a high side mode suppression ratio, so that oscillation can be obtained over a wide wavelength band.

Followings are additional explanations to the oscillation stability, setting accuracy and reproducibility of an oscillation wavelength.

(1) Oscillation stability

In the present invention, the wavelength resolution of the diffraction grating serves to roughly set the oscillation wavelength of the light source, and the wavelength is strictly decided by the phase coupling of the optical cavity mode and the feed back light from the optical reflection member 3.

When the phase coupling cycle is substantially equivalent to, or more than, the wavelength resolution of the diffraction grating, the number of compound cavity modes existing within the range of the wavelength resolution of the diffraction grating is one (as shown in FIGS. 4A, 4B, and 4C), and oscillation unstable factors such as mode hopping, mode competition, and the like can be eliminated.

(2) Setting accuracy and reproducibility of oscillation wavelength

In the present invention, the setting accuracy and reproducibility are decided by the wavelength position of the compound cavity mode, and the wavelength setting resolution of the diffraction grating must at least have a wavelength setting accuracy and reproducibility enough to include compound cavity mode existing near the target wavelength, within the wavelength resolution of the diffraction grating.

In this state, the accuracy and reproducibility of the light source are finally decided, for example, by the distance between the optical reflection member 3 and the optical cavity 11, where the light source has a structure in which the optical reflection member 1 is a diffraction grating as shown in FIG. 1.

That is, normally, the FSR of the optical cavity 11 consisting of an optical reflection member 1 and an optical reflection member 2 is about 10 to 40 pm, and the optical cavity modes are disposed at a sufficiently fine wavelength interval.

One of these modes is selected practically by the feedback light of the light source, thereby forming a compound cavity mode. Therefore, the setting accuracy and reproducibility of the light source are practically decided by the phase of the feedback light, i.e., the position of the optical reflection member 3.

Since the distance between the optical reflection member 3 and the optical cavity 11 is normally set to several mm, the wavelength interval of the compound cavity mode is several hundreds pm. A number of compound cavity modes stand at an FSR interval, and therefore, the wide band characteristic can be realized by selecting one of those modes.

Therefore, the wavelength change range of the compound cavity mode need at least be moved by one FSR.

Therefore, the actuator which changes the position of the optical reflection member 3 does not require a stepping motor or the like, but only the displacement of the PZT (about several tens $\mu$m) is sufficient.

As a result, according to the present invention, the accuracy and reproducibility of the oscillation wavelength of the entire light source can be controlled by an electric high resolution ability control element such as a PZT or the like. The accuracy and reproducibility of about 10 pm which cannot be attained by a conventional light source can be realized.

In the first embodiment of the present invention, due to misalignment between the optical cavity 11 and the optical reflection member 3 and absorption by an optical element, the laser beam emitted from the laser light source 13 and fed back again to the laser light source 13 by the optical reflection member 3 may cause a large loss.

Therefore, if the oscillation of the laser light source 13 is strengthened in this case, the intensity ratio of the photoelectric field fed back from the optical reflection member 3 with respect to the intensity of the laser electric field resonating in the optical cavity 11 is lowered, and finally, the laser light source 13 singly oscillates.

In the second embodiment of the present invention, in order to ease influences therefrom, an optical gain medium 5 is provided between optical reflection members 2 and 3, thereby compensating for the losses, so that a strong compound cavity system is constructed. Simultaneously, the intensity of light fed back to the laser light source 13 is increased, thereby obtaining an effect of reducing influences onto the phase difference between the phase of the feedback light and the light inside the optical cavity 11.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A tunable wavelength laser light source apparatus comprising:

a first optical reflection member comprising a diffraction grating having a predetermined wavelength resolution;

a second optical reflection member comprising a half-mirror, said second optical reflection member being provided opposite to the first optical reflection member at a first predetermined distance, whereby an optical cavity is formed between the first and second optical reflection member, said optical cavity having an optical cavity mode standing with a free spectrum range $FSR1=\lambda^2/2nL$ (where $\lambda$ is a light wavelength, n is a refractive index, and L is a cavity length which corresponds to the first predetermined distance), and said half-mirror allowing part of light from inside the optical cavity to be transmitted therethrough to outside of the optical cavity and allowing reflection light from outside of the optical cavity to return therethrough to the optical cavity;

an optical gain medium comprising a semiconductor laser having ends coated with anti-reflection coatings, said optical gain medium being provided between the first and second optical reflection members, whereby a laser light source is provided, which oscillates in the optical cavity mode;

a third optical reflection member comprising a feedback mirror for returning to the optical cavity as said reflection light the part of the light transmitted from inside the optical cavity through said half-mirror to outside the optical cavity, said third optical reflection member being provided opposite to the second optical reflection member at a second predetermined distance which is set to be far smaller than the first predetermined distance based on a predetermined full width at half maximum which defines the predetermined wavelength resolution of the diffraction grating, whereby a compound cavity is provided, said compound cavity having a compound cavity mode standing with a predetermined free spectrum range $FSR2=\lambda^2/2nL$ (where $\lambda$ is a light wavelength, n is a refractive index, and L is a light path length which corresponds to the second predetermined distance), and said compound cavity mode emphasizing the optical cavity mode of the optical cavity, which stands at intervals of FSR2;

a variable mechanism comprising a piezoelectric element for varying the second predetermined distance by changing a position of the third optical reflection member on an optical axis; and a rotation mechanism for changing a center of a wavelength discrimination curve thereof, which has the predetermined full width at half maximum which defines the predetermined wavelength resolution of diffraction grating, by rotating the diffraction grating, thereby to select one of a plurality of oscillation wavelengths standing in the compound cavity mode of the compound cavity, effecting a single mode oscillation, and for sweeping the compound cavity mode in wavelength in cooperation with the variable mechanism;

wherein the compound cavity mode is generated when an electromagnetic field inside of the optical cavity is coupled in phase to a reflection electromagnetic field from the third reflection member; and wherein oscillation gain becomes high at a wavelength at which the compound cavity mode stands, and original modes which are due to the optical cavity are suppressed, thereby ensuring that oscillation starts with the compound cavity mode selected by rotation of the diffraction grating.

2. A tunable wavelength laser light source apparatus according to claim 1, further comprising an optical element provided between the optical gain medium and at least one of the first and second optical reflection members.

3. A tunable wavelength laser light source apparatus according to claim 2, wherein the optical element comprises a collimating lens.

4. A tunable wavelength laser light source apparatus according to claim 1, wherein the rotation mechanism comprises at least one of a motor and a piezoelectric element.

5. A tunable wavelength laser light source apparatus according to claim 1, wherein the second reflection member is formed on one of end faces of the optical gain medium.

6. A tunable wavelength laser light source apparatus comprising:

a first optical reflection member comprising a diffraction grating having a predetermined wavelength resolution;

a second optical reflection member comprising a half-mirror, said second optical reflection member being provided opposite to the first optical reflection member at a first predetermined distance, whereby an optical cavity is formed between the first and second optical reflection member, said optical cavity having an optical cavity mode standing with a free spectrum range $FSR1=\lambda^2/2nL$ (where $\lambda$ is a light wavelength, n is a refractive index, and L is a cavity length which corresponds to the first predetermined distance), and said half-mirror allowing part of light from inside the optical cavity to be transmitted therethrough to outside of the optical cavity and allowing reflection light from outside of the optical cavity to return therethrough to the optical cavity;

a first optical gain medium comprising a semiconductor laser having ends coated with anti-reflection coatings, said first optical gain medium being provided between the first and second optical reflection members, whereby a laser light source is provided, which oscillates in the optical cavity mode;

a third optical reflection member comprising a feedback mirror for returning to the optical cavity as said reflection light the part of the light transmitted from inside the optical cavity through said half-mirror to outside the optical cavity, said third optical reflection member being provided opposite to the second optical reflection member at a second predetermined distance which is set to be far smaller than the first predetermined distance based on a predetermined full width at half maximum which defines the predetermined wavelength resolution of the diffraction grating, whereby a compound cavity is provided, said compound cavity having a compound cavity mode standing with a predetermined free spectrum range $FSR2=\lambda^2/2nL$ (where $\lambda$ is a light wavelength, n is a refractive index, and L is a light path length which corresponds to the second predetermined distance), and said compound cavity mode emphasizing the optical cavity mode of the optical cavity, which stands at intervals of FSR2;

a variable mechanism comprising a piezoelectric element for varying the second predetermined distance by changing a position of the third optical reflection member on an optical axis;

a rotation mechanism for changing a center of a wavelength discrimination curve thereof, which has the predetermined full width at half maximum which defines the predetermined wavelength resolution of diffraction grating, by rotating the diffraction grating, thereby to select one of a plurality of oscillation wavelengths standing in the compound cavity mode of the compound cavity, effecting a single mode oscillation, and for sweeping the compound cavity mode in wavelength in cooperation with the variable mechanism; and a second gain medium for use in optical amplification provided between the second and third optical reflection members to compensate for losses on a feedback light path of said reflection light;

wherein the compound cavity mode is generated when an electromagnetic field inside of the optical cavity is coupled in phase to a reflection electromagnetic field from the third reflection member;

wherein oscillation gain becomes high at a wavelength at which the compound cavity mode stands, and original modes which are due to the optical cavity are suppressed, thereby ensuring that oscillation starts with the compound cavity mode selected by rotation of the diffraction grating;

wherein the second gain medium also ensures that light a wavelength of which is amplified is returned to the optical cavity, whereby the tunable wavelength laser light source apparatus obtains a high stability; and wherein a wavelength obtained by the tunable wavelength laser light source apparatus is determined in accordance with a position of the third optical reflection member, thus ensuring that artificial wavelength continuous sweeping is achieved in sweeping performed with the variable mechanism.

7. A tunable wavelength laser light source apparatus according to claim 6, further comprising an optical element provided between the optical gain medium and at least one of the first and second optical reflection members.

8. A tunable wavelength laser light source apparatus according to claim 7, wherein the optical element comprises a collimating lens.

9. A tunable wavelength laser light source apparatus according to claim 6, wherein the rotation mechanism comprises at least one of a motor and a piezoelectric element.

10. A tunable wavelength laser light source apparatus according to claim 6, wherein the second reflection member is formed on one of end faces of the optical gain medium.

11. A tunable wavelength laser light source apparatus according to claim 6, wherein the third reflection member is formed on one of end faces of the second optical gain medium.

* * * * *